(12) United States Patent
Blanchard (10) Patent No.: US 6,724,044 B2
(45) Date of Patent: Apr. 20, 2004

(54) MOSFET DEVICE HAVING GEOMETRY THAT PERMITS FREQUENT BODY CONTACT

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/142,674

(22) Filed: May 10, 2002

(65) Prior Publication Data

US 2003/0209759 A1 Nov. 13, 2003

(51) Int. Cl.[7] ............................................. H01L 29/94
(52) U.S. Cl. ........................................ 257/341; 257/401
(58) Field of Search ................................. 257/276, 341, 257/343, 503, 505, 518, 554, 573, 584, 288, 340, 342, 344, 345, 346, 335, 336, 337, 338, 339, 401, 368

(56) References Cited

U.S. PATENT DOCUMENTS

| | | | |
|---|---|---|---|
| 5,079,605 A | * | 1/1992 | Blake |
| 5,447,876 A | | 9/1995 | Moyer et al. .................. 437/41 |
| 5,972,804 A | * | 10/1999 | Tobin et al. |
| 6,140,167 A | * | 10/2000 | Gardner et al. |
| 6,404,013 B1 | * | 6/2002 | Chen et al. |

* cited by examiner

Primary Examiner—Nathan J. Flynn
Assistant Examiner—Kevin Quinto
(74) Attorney, Agent, or Firm—Mayer Fortkort & Williams, PC; David B. Bonham, Esq.; Karin L. Williams, Esq.

(57) ABSTRACT

A MOSFET device design is provided that effectively addresses the problems arising from the parasitic bipolar transistor that is intrinsic to the device. The MOSFET device comprises: (a) a body region; (b) a plurality of body contact regions; (c) a plurality of source regions; (d) a plurality of drain regions; and (d) a gate region. In plan view, the source regions and the drain regions are arranged in orthogonal rows and columns, and at least a portion of the body contact regions are bordered by four of the source and drain regions, preferably two source regions and two drain regions.

27 Claims, 5 Drawing Sheets

MOSFET DEVICE HAVING GEOMETRY THAT PERMITS FREQUENT BODY CONTACT

BACKGROUND OF THE INVENTION

MOSFET (metal oxide semiconductor field effect transistor) devices are often fabricated having three separate terminals, with those terminals being the source, the gate, and the drain. In these devices, the source and body regions are typically shorted to one another.

Figure 1:
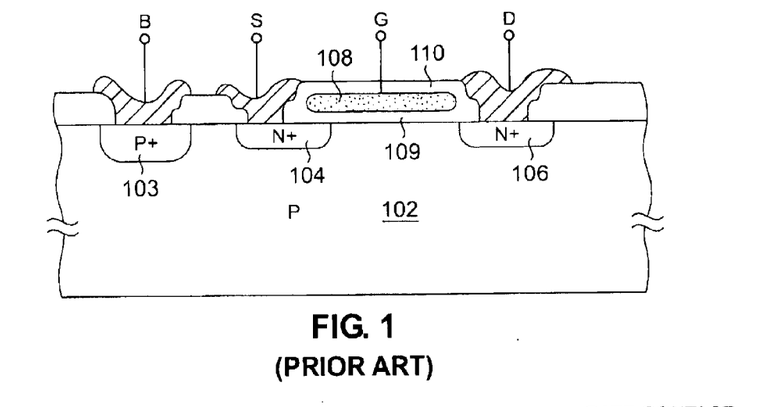
FIG. 1 is a schematic partial cross-sectional view of a conventional MOSFET device in the prior art having four separate terminals.

In other designs, however, the MOSFET device is fabricated having four separate terminals, with the fourth terminal being the body terminal. A typical four-terminal MOSFET structure is shown in FIG. 1. This structure contains a P-type body region 102 with P+ body contact region 103, an N+ source region 104, an N+ drain region 106 and a gate region, which consists of a doped polycrystalline silicon conductive region 108 and a gate dielectric layer 109. An insulating layer 110 is provided over the conductive region 108.

In many applications, it is important to control the voltage of the body with respect to the source under all conditions. For example, as is well known in the art, there is a parasitic bipolar transistor that is intrinsic to the MOSFET device. Referring to FIG. 1, for example, the parasitic bipolar NPN transistor is intrinsically formed from the N-type source region 104 as the emitter, the P-type body region 102 as the base and the N-type drain region 106 as the collector. This parasitic NPN transistor can become active when the source-to-body voltage within the MOSFET exceeds the forward voltage of the PN junction that exists between the source and body regions. Activation of the parasitic transistor can lead to latchback, interfering with the intended operation of the MOSFET as well as the circuit that contains the MOSFET.

By supplying separate body contacts within the device, the voltage of the body with respect to the source can be controlled. Alternatively, the source and drain terminals of the device can be allowed to exchange their functions, thus permitting current to flow in one direction at some times, and a second direction at other times. In either case, the adverse effect of the parasitic transistor within the device is dealt with.

In a MOSFET device that is intended to supply large currents or to switch rapidly, the number of body contacts and their locations can be critical to the prevention of latchback, and hence to the successful operation of the device. Various geometries have been proposed for MOSFET devices having separate body contacts. For example, cellular geometries with body contact regions located at the boundaries of the MOSFET array, as well as between regions of the array, have been proposed. Interdigitated source and drain regions with separate body contact regions are another example.

SUMMARY OF THE INVENTION

The present invention is directed to a particularly effective family of MOSFET device designs in which body contact regions are brought into close proximity with the source and drain regions.

According to an embodiment of the invention, a MOSFET device is provided that comprises: (a) a body region; (b) a plurality of body contact regions; (c) a plurality of source regions; (d) a plurality of drain regions; and (d) a gate region, wherein, in plan view, the source regions and the drain regions are arranged in orthogonal rows and columns, and at least a portion of the body contact regions are bordered by four of the source and drain regions, preferably two source regions and two drain regions.

In more preferred embodiments, the MOSFET device comprises: (1) a semiconductor region of first conductivity type having an upper surface; (2) a plurality of source regions of a second conductivity type formed within an upper portion of the semiconductor region adjacent the upper surface; (3) a plurality of drain regions of the second conductivity type formed within an upper portion of the semiconductor region adjacent the upper surface; (4) a plurality of body contact regions of the first conductivity type formed within an upper portion of the semiconductor region adjacent the upper surface, the body contact regions having a net doping concentration that is higher than that of the semiconductor region; and (5) a gate region disposed over the upper surface of the semiconductor region, the gate region comprising (a) a gate electrode region and (b) a gate dielectric layer disposed between the gate electrode region and the semiconductor region. When viewed from above the upper surface (i.e., in plan view), the source regions and the drain regions of this MOSFET device are arranged in orthogonal rows and columns, and at least a portion of the body contact regions are bordered by four of the source and drain regions, more preferably two source regions and two drain regions.

Preferably, the semiconductor region is a silicon semiconductor region, the first conductivity type is P-type conductivity, and the second conductivity type is N-type conductivity. The gate electrode preferably is a doped polysilicon electrode, and the gate dielectric preferably is silicon dioxide.

In preferred embodiments, the source regions and the drain regions are provided in an alternating arrangement within the orthogonal rows and columns.

In some embodiments, when viewed from above the upper surface, the source regions and the drain regions are in the shape of octagons. The octagons can be, for example, regular octagons or elongated octagons having two planes of symmetry.

Similarly, when viewed from above the upper surface, the body contact regions are in the shape of octagons in some embodiments. In other embodiments, the body contact regions can be in the shape of squares or diamonds when viewed from above the upper surface.

The ratio of source regions to body contact regions can vary. For example, each source region can be provided, on average, with (a) one adjacent body contact region, (b) two adjacent body contact regions or (c) four adjacent body contact regions.

In preferred embodiments, a multilayer interconnect structure is provided over the MOSFET device.

One advantage of the present invention is that a MOSFET device design is provided, which effectively addresses the problems arising from the parasitic bipolar transistor that is intrinsic to the device.

Another advantage of the present invention is that body contact regions can be provided throughout the MOSFET device, with little loss of shared source/drain perimeter area, and hence with little loss in current density.

These and other embodiments and advantages of the present invention will become immediately apparent to those of ordinary skill in the art upon review of the Detailed Description and Claims to follow.

DETAILED DESCRIPTION OF THE INVENTION

The present invention provides a novel MOSFET geometry in which body contact regions are efficiently interspersed among the source and drain regions of the device.

Figure 2:
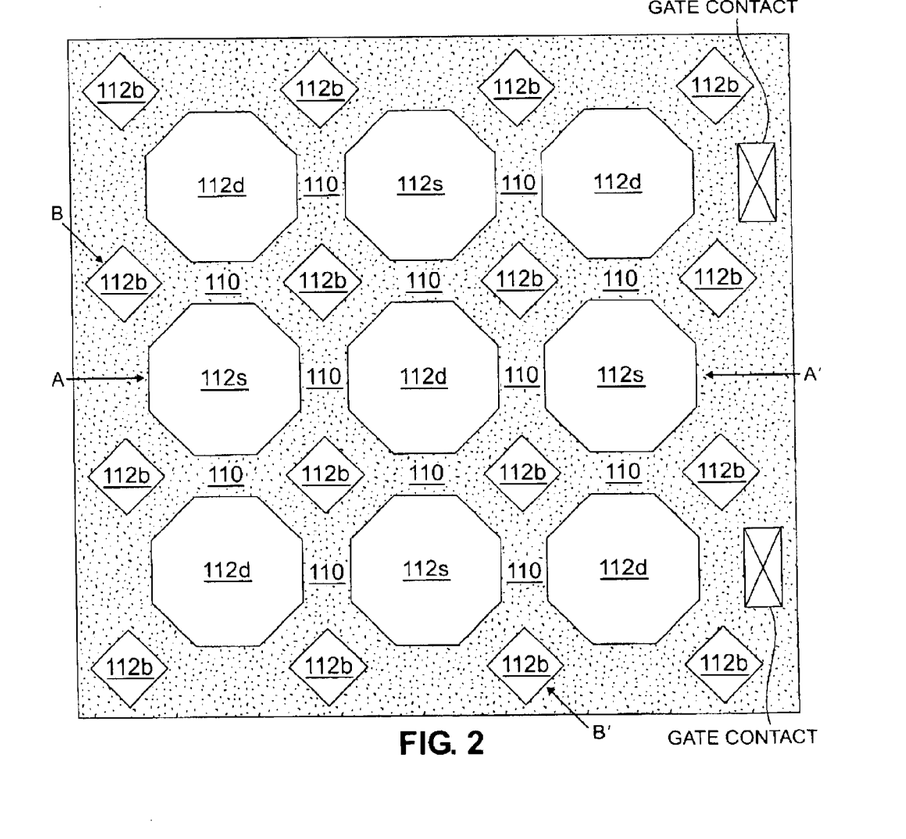
FIG. 2 is a schematic partial plan view of a MOSFET device in accordance with an embodiment of the present invention.
Figure 3A:
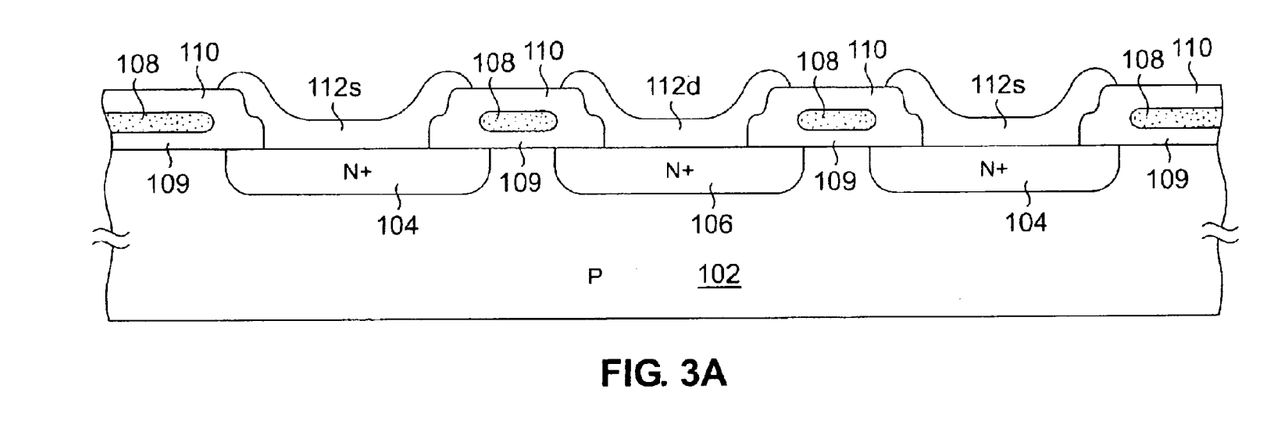
FIG. 3A is a schematic partial cross-sectional view of the MOSFET device of FIG. 2, taken along line A–A'.
Figure 3B:
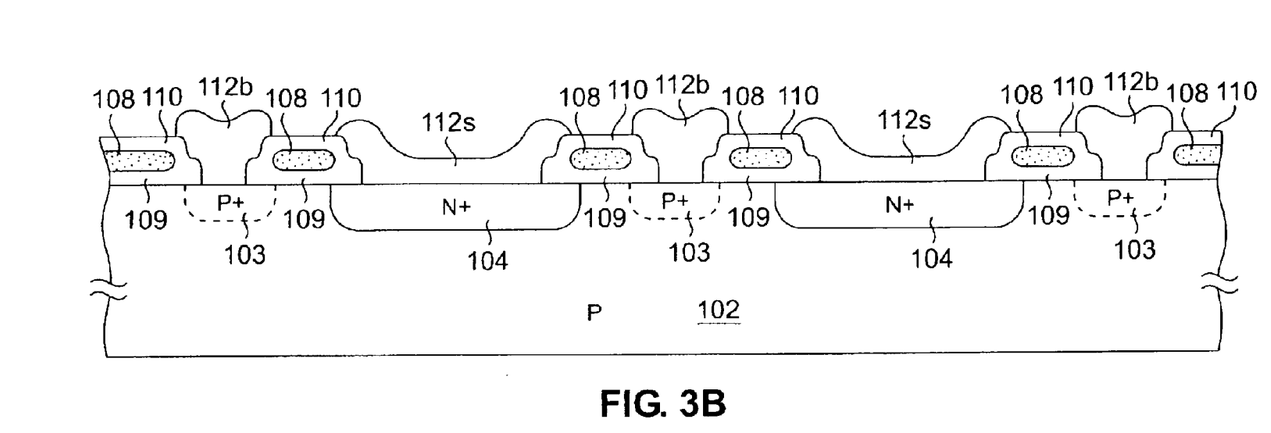
FIG. 3B is a schematic partial cross-sectional view of the MOSFET device of FIG. 2, taken along line B–B'.

One specific embodiment of the invention is discussed in connection with FIG. 2, which is a partial plan view of a MOSFET device having orthogonal rows of octagonal source and drain regions, with body contact regions that are provided in the space that exists between four of the octagons. FIGS. 3A and 3B, represent cross-sectional views of the MOSFET device of FIG. 2, taken along lines A–A' and B–B', respectively.

Referring now to these figures, the device illustrated has a P-type body region 102, which can be, for example, a P-well, a semiconductor substrate wafer or, more preferably, an epitaxial layer that is grown over a semiconductor wafer. The p-type body region 102 in this example typically has a net surface doping concentration ranging, for example, from $10^{14}$ to $10^{16}$ cm$^{-3}$.

The semiconductor material in this example is silicon. However, the designs of the present invention can be used in connection with other semiconductors, including other elemental semiconductors, such as Ge, as well as compound semiconductors, such as SiGe, SiGeC and III–V semiconductors (e.g., GaAs, GaP, GaAsP, InP, GaAlAs, InGaP, etc.).

N+ source regions 104, N+ drain regions 106 and P+ body contact regions 103 are present at the top surface of the p-type body region 102. The N+ source regions 104 and N+ drain regions 106 in this example typically have a net surface doping concentration ranging, for example, from $10^{19}$ to $10^{21}$ atoms/cm$^3$. The P+ body contact regions 103 in this example also typically have a net surface doping concentration ranging, for example, from $10^{19}$ to $10^{21}$ atoms/cm$^3$.

The gate region of the device includes a conductive gate electrode region 108, which can be, for example, a metal region, a doped polycrystalline silicon (polysilicon) region, or a combination of the same. The gate region 108 is beneficially provided in the form of a mesh or lattice that is generally located over the areas between the source regions 104, drain regions 106 and body contact regions 103. The gate region further includes a gate dielectric layer 109, which can be, for example, silicon dioxide or another suitable dielectric material. An additional dielectric layer 110, for example a layer of silicon dioxide, a layer of BPSG (borophosphosilicate glass) or a combination thereof, is preferably provided over the gate electrode region 108.

Source metallization 112s, drain metallization 112d and body metallization 112b are provided over the source regions 104, drain regions 106 and body contact regions 103, respectively. The source, drain and body regions may be connected using one or more layers of interconnect, not illustrated in FIG. 2.

As noted above, the device of FIG. 2 utilizes regular octagonal source regions 104 and drain regions 106 that are alternatively arranged in orthogonal rows and columns. As a result of this arrangement, semiconductor space is made available, at the diagonal corners of the source and drain regions, for the body contact regions 103. In this arrangement, each body contact region 103 is surrounded by four octagons, of which two are source regions 104 and two are drain regions 106 in the embodiment shown. Hence, the body contact regions 103 are arranged along lines diagonal to the orthogonal rows and columns of source regions 104 and drain regions 106. This arrangement permits the body contact regions 103 to be present throughout the MOSFET device structure. Moreover, in this design, the portion of the source perimeter that is furthest from a body contract region is the center of the source perimeter between the two body contact regions, a very effective arrangement from a latchback prevention standpoint. This geometry also allows the source and drain regions to be reversed in function without any change in performance.

Figure 4:
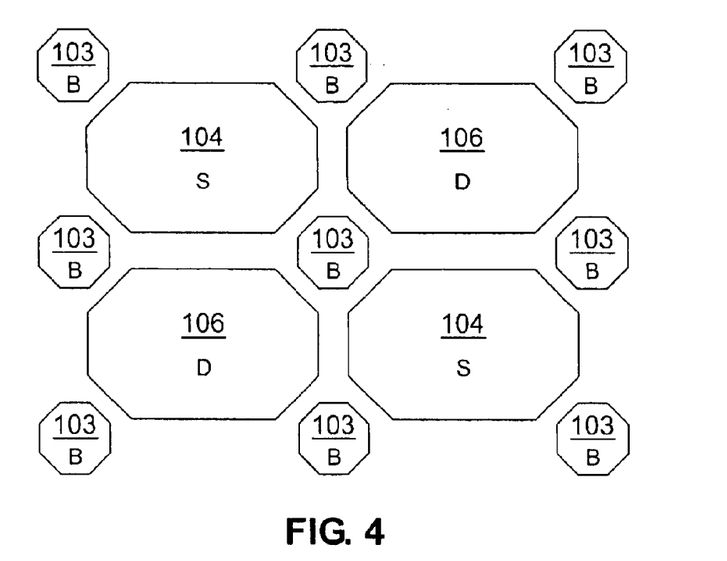
FIG. 4 is a partial plan view of a layout scheme for the source, drain and body contact regions of a MOSFET device, in accordance with an embodiment of the present invention.

FIG. 4 is a plan view of another layout scheme for MOSFET source regions 104, drain regions 106, and body contact regions 103 in accordance with an embodiment of the present invention. It is noted that the MOSFET device design of FIG. 2 above utilizes regular octagons, which have four planes of symmetry (i.e., one vertical, one horizontal, and two diagonal). In contrast, the MOSFET device design of FIG. 4 includes elongated octagonal source regions 104 and drain regions 106, which have two planes of symmetry (i.e., one vertical, one horizontal). By utilizing such elongated octagons, further device flexibility is provided. For example, by making the octagons long relative to their widths, the shared perimeter area between the source and the drain per unit area can be increased. At the same time, the length of the octagons can be varied as needed to combat latchback. It is also noted that the MOSFET device design of FIG. 2 contains diamond-shaped (or square-shaped, depending on perspective) body contact regions, while the body contact regions 103 in the design of FIG. 4 are octagonal.

In the above embodiments, the ratio of body contact regions 103 to source regions 104 is essentially 2:1, with each source region 104 being surrounded by four body contact regions 103 (and with each interior body contact region 103 being surrounded by two source regions 104 and two drain regions 106). In other embodiments, a lower ratio may suffice. In such embodiments, the source regions 104 and drain regions 106 preferably deviate from octagonal in order to maximize their shared perimeter area.

Figure 5A:
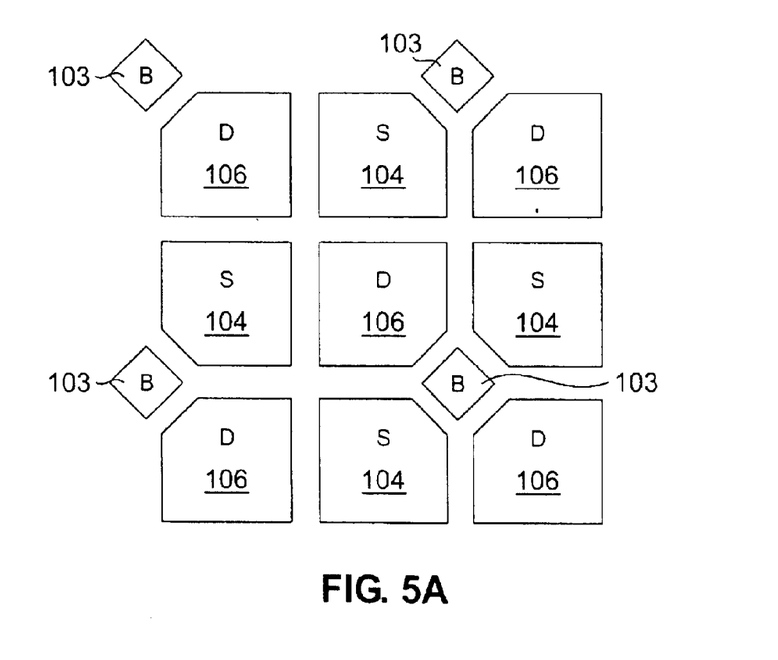
FIGS. 5A and 5B are partial plan views of additional layout schemes for the source, drain and body contact regions of MOSFET devices, in accordance with embodiments of the present invention.
Figure 5B:
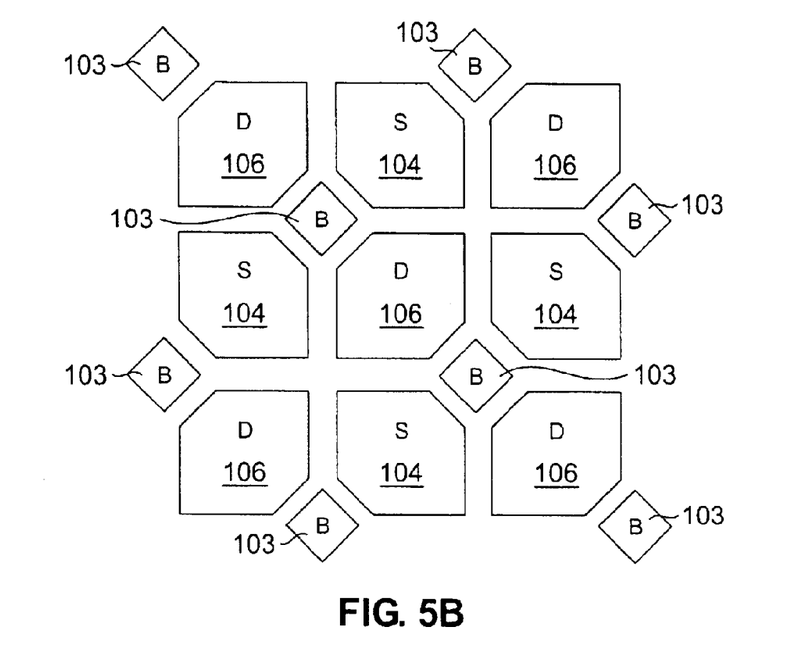

Specific examples of such a device designs are illustrated in FIGS. 5A and 5B, which are plan views of layout schemes for MOSFET source regions 104, drain regions 106, and body contact regions 103 in accordance with other embodiments of the present invention. In the device of FIG. 5A, the ratio of body contact regions 103 to source regions 104 is essentially 0.5:1, and each source region 104 is adjacent to a single body contact region 103, while in the device of FIG. 5B, the ratio is essentially 1:1, and each source region 104 is adjacent to two body contact regions 103. (In each case, each interior body contact region 103 is surrounded by two source regions 104 and two drain regions 106.)

The MOS devices of the present invention can be produced using any number of known processes. One process for manufacturing the MOS devices of the invention follows, but other processes are clearly possible.

The process begins with a p-type semiconductor 102, which may be, for example, a p-type semiconductor wafer, a p-well, or a p-type epitaxial region that has been grown upon a semiconductor wafer. The wafer is initially subjected to an oxidation step, forming a field oxide layer (not shown). A masking layer (not shown) is then provided over the device and the field oxide removed in the active area. Subsequently, a gate oxide layer 109, ranging, for example, from 50 to 1000 Angstroms in thickness is grown on the surface of the exposed active area, for example, by wet and/or dry oxidation.

Figure 6A:
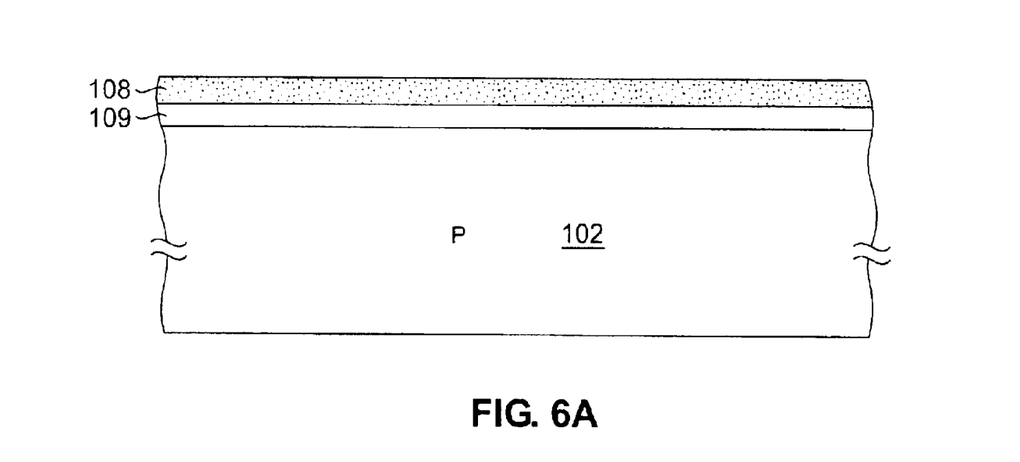
FIGS. 6A–6C are schematic partial cross-sectional views illustrating a method of fabricating the MOSFET device of FIG. 2, taken from along a perspective like that of line B–B' of FIG. 2, in accordance with an embodiment of the present invention.

A polysilicon layer 108 is then provided over the structure, preferably using CVD. The polysilicon is typically doped N-type to reduce its resistivity. N-type doping can be carried out, for example, during CVD with phosphine gas, by thermal predeposition using phosphorous oxychloride, or by implantation with arsenic and/or phosphorous. The resulting structure is illustrated in FIG. 6A.

Figure 6B:
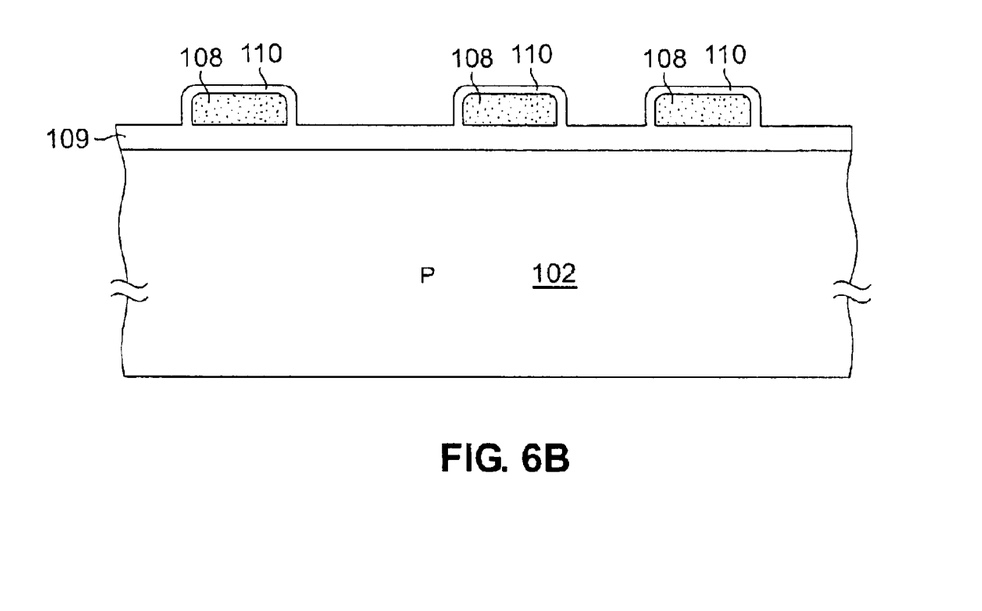

A layer of photoresist is applied over the polysilicon layer, and a pattern is transferred from a mask to the photoresist layer as is well known in the art. The polysilicon layer is then etched, for example, by an anisotropic etching step, creating polysilicon regions 108 where the photoresist remains on the polysilicon following the develop step (as noted above, the polysilicon regions 108 are typically part of a single region, i.e., a continuous polysilicon mesh or lattice). A wet or dry oxidation step, an oxide deposition process, or a combination thereof is then performed, forming an oxide layer 110 over the exposed polysilicon. The resulting structure is illustrated in FIG. 6B.

Figure 6C:
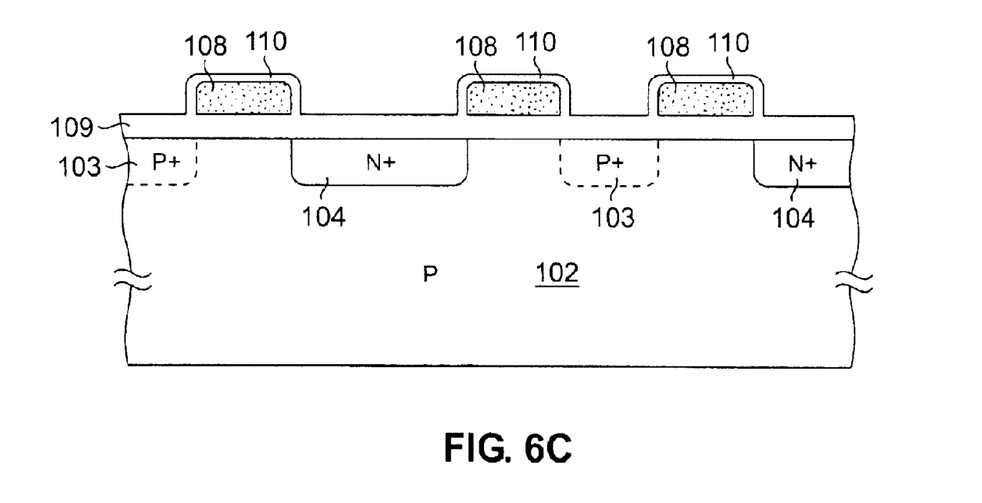

A patterned photoresist layer (not shown) is then provided over the device as a source/drain mask. A source/drain implant is then performed using, for example, arsenic and/or phosphorous as a dopant. The photoresist layer is then removed. Another patterned photoresist layer (not shown) is then provided over the device as a body contact mask. A body contact implant is then performed using, for example, boron as the doping material. The photoresist is again removed. The structure is then subjected to an annealing step in which the dopants are diffused into the semiconductor, forming body contact regions 103, drain regions (not shown in the particular cross section illustrated) and source regions 104. The resulting structure is presented in FIG. 6C.

The structure is then masked and contact holes associated with the source regions 104, drain regions 106 and body contact regions 103 are etched in the oxide layer 109. A conductive layer, for example, a metal layer such as aluminum alloy, is then deposited over the structure. A masking layer is then provided and the conductive layer is then etched to provide distinct source metallization 112s, drain metallization 112d, and body metallization 112b (see, e.g., FIGS. 3A and 3B above).

Although not illustrated, a multilayer interconnect structure (not shown) is preferably provided over the device of to allow independent contact with the source regions, drain regions and body contact regions. Such multilayer interconnect structures are well known in the transistor art and can be formed, for example, using known techniques such as conventional multi-layer metal techniques, conductive layers with vias, or dual damascene techniques.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A MOSFET device comprising:
    a semiconductor region of first conductivity type having an upper surface;
    a plurality or source regions of a second conductivity type formed within an upper portion of said semiconductor region adjacent said upper surface;
    a plurality of drain regions of said second conductivity type formed within an upper portion of said semiconductor region adjacent said upper surface;
    a plurality of body contact regions of said first conductivity type formed within an upper portion of said semiconductor region adjacent said upper surface; said body contact regions having a net doping concentration that is higher than that of said semiconductor region; and
    a gate region disposed over said upper surface of said semiconductor region, said gate region comprising (a) a gate electrode region, wherein said gate electrode region comprises a continuous region with openings therein for said plurality of source regions, said plurality of drain regions and said plurality of body contact regions, and (b) a gate dielectric layer disposed between said gate electrode region and said semiconductor region,
        wherein, when viewed from above said upper surface, said source regions and said drain regions are arranged in orthogonal rows and columns, and wherein at least a portion of said body contact regions are bordered by four of said source and drain regions, and
        further wherein the body contact regions inside a perimeter of said plurality of source regions or said plurality of drain regions are completely surrounded by said gate electrode region.

2. The MOSFET device of claim 1 wherein said first conductivity type is P-type conductivity and said second conductivity type is N-type conductivity.

3. The MOSFET device of claim 1 wherein said semiconductor region is a silicon semiconductor region.

4. The MOSFET device of claim 1 wherein said gate electrode region is a doped polysilicon electrode region.

5. The MOSFET device of claim 1 wherein said gate dielectric is silicon dioxide.

6. The MOSFET device of claim 1 wherein, when viewed from above said upper surface, said source regions and said drain regions are in the shape of octagons.

7. The MOSFET device of claim 6 wherein said octagons are regular octagons.

8. The MOSFET device of claim 6 wherein said octagons are elongated octagons having two planes of symmetry.

9. The MOSFET device of claim 6 wherein, when viewed from above said upper surface, said body contact regions are in the shape of octagons.

10. The MOSFET device of claim 6 wherein, when viewed from above said upper surface, said body contact regions are in the shape of squares or diamonds.

11. The MOSFET device of claim 1, wherein each source region is provided with four adjacent body contact regions.

12. The MOSFET device of claim 1, wherein each source region is provided with two adjacent body contact regions.

13. The MOSFET device of claim 1, wherein each source region is provided with one adjacent body contact region.

14. The MOSFET device of claim 1, wherein said portion of said body contact regions are bordered by two source regions and two drain regions.

15. The MOSFET device of claim 1, wherein said source regions and said drain regions are provided in an alternating arrangement within said orthogonal rows and columns.

16. The MOSFET device of claim 1, wherein a multilayer interconnect structure is provided over said MOSFET device.

17. A MOSFET semiconductor device comprising: (a) a body region; (b) a plurality of body contact regions; (c) a plurality of source regions; (d) a plurality of drain regions; and (d) a gate region, said gate region comprising a continuous sheet having openings for said plurality of body contact regions, said plurality or source regions and said plurality of drain regions, wherein, in plan view, said source regions and said drain regions are arranged in orthogonal rows and columns, and wherein at least a portion of said body contact regions are bordered by four of said source and drain regions, and wherein the body contact regions inside the perimeter rows of said plurality of source regions and said plurality of drain regions are completely surrounded by said gate region.

18. The MOSFET device of claim 17 wherein, in plan view, said source regions and said drain regions are in the shape of octagons.

19. The MOSFET device of claim 18 wherein said octagons are regular octagons.

20. The MOSFET device of claim 18 wherein said octagons are elongated octagons having two planes of symmetry.

21. The MOSFET device of claim 17 wherein, in plan view, said body contact regions are in the shape of octagons.

22. The MOSFET device of claim 17 wherein, in plan view, said body contact regions are in the shape of squares or diamonds.

23. The MOSFET device of claim 17, wherein said source regions and said drain regions are provided in an alternating arrangement within said orthogonal rows and columns.

24. The MOSFET device of claim 17, wherein said portion of said body contact regions are bordered by two source regions and two drain regions.

25. The MOSFET device of claim 17, wherein each source region is provided with four adjacent body contact regions.

26. The MOSFET device of claim 17, wherein each source region is provided with two adjacent body contact regions.

27. The MOSFET device of claim 17, wherein each source region is provided with one adjacent body contact region.

* * * * *

UNITED STATES PATENT AND TRADEMARK OFFICE
CERTIFICATE OF CORRECTION

PATENT NO. : 6,724,044 B2  
DATED : April 20, 2004  
INVENTOR(S) : Richard A. Blanchard It is certified that error appears in the above-identified patent and that said Letters Patent is hereby corrected as shown below:

Title page,  
Item [57], ABSTRACT,  
Line 6, after "and", change "(d)" to -- (e) --.

Column 1,  
Line 66, after "and", change "(d)" to -- (e) --.

Column 3,  
Line 45, after first word "The", change "p-type" to -- P-type --.  
Line 56, first word, change "p-type" to -- P-type --.

Column 5,  
Line 15, after "with a", change "p-type" with -- P-type --.  
Line 16, after "for example, a", change "p-type" with -- P-type --.  
Line 17, after first word "a" , change "p-well", to -- P-well --.  
Line 17, after "a", second occurence, change "p-type" to -- P-type --.

Column 6,  
Line 2, after "device", delete -- of --.

Column 7,  
Line 22, after first word "and", change "(d)" to -- (e) --.

Signed and Sealed this

Seventeenth Day of August, 2004

JON W. DUDAS  
*Acting Director of the United States Patent and Trademark Office*